United States Patent
Yu et al.

(10) Patent No.: US 9,885,236 B2
(45) Date of Patent: Feb. 6, 2018

(54) LWD REAL-TIME BOREHOLE IMAGE TRANSMISSION

(71) Applicant: Schlumberger Technology Corporation, Sugar Land, TX (US)

(72) Inventors: Bo Yu, Sugar Land, TX (US); Han Yu, Sugar Land, TX (US); Remi Hutin, New Ulm, TX (US); Yong Sun, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 207 days.

(21) Appl. No.: 14/549,408

(22) Filed: Nov. 20, 2014

(65) Prior Publication Data
US 2015/0078625 A1    Mar. 19, 2015

Related U.S. Application Data

(63) Continuation of application No. 13/850,243, filed on Mar. 25, 2013, now Pat. No. 8,958,604.

(51) Int. Cl.
| | |
|---|---|
| *G06T 17/05* | (2011.01) |
| *E21B 47/12* | (2012.01) |
| *G06K 9/00* | (2006.01) |
| *E21B 33/12* | (2006.01) |
| *H03M 7/30* | (2006.01) |
| *H03M 7/40* | (2006.01) |

(52) U.S. Cl.
CPC .......... *E21B 47/12* (2013.01); *E21B 33/1208* (2013.01); *G06K 9/0063* (2013.01); *H03M 7/3059* (2013.01); *H03M 7/3068* (2013.01); *H03M 7/3077* (2013.01); *H03M 7/40* (2013.01)

(58) Field of Classification Search
CPC .... E21B 33/138; H04N 19/18; H04N 7/0135; G06F 17/156; G06K 9/00973; G06T 9/007
See application file for complete search history.

(56) References Cited

U.S. PATENT DOCUMENTS

| | | | |
|---|---|---|---|
| 6,337,568 B1 * | 1/2002 | Tutunji | G01N 24/081 324/300 |
| 2003/0123743 A1 * | 7/2003 | Zandi | G06F 17/148 382/240 |
| 2005/0046592 A1 | 3/2005 | Cooper et al. | |
| 2007/0112521 A1 | 5/2007 | Akimov et al. | |

(Continued)

OTHER PUBLICATIONS

Search Report R. 61 or R 63 EPC issued in corresponding EP application 14773382.8 dated Oct. 28, 2016. 3 pages.

(Continued)

*Primary Examiner* — Iman K Kholdebarin
*Assistant Examiner* — Mai Tran

(57) ABSTRACT

Data transmission from a bottom hole assembly (BHA) includes obtaining a scan from multiple scans forming a downhole data log of a borehole within a subterranean formation. The scan includes a sequence of data items from a sensor in the BHA located in the borehole. Each data item corresponds to an azimuth angle of the sensor. Further, compressed scan data is generated from the sequence of data items on a per-scan basis, and transmitted, using a predetermined borehole telemetry, to a surface unit.

12 Claims, 5 Drawing Sheets

(56) References Cited

U.S. PATENT DOCUMENTS

| | | | |
|---|---|---|---|
| 2009/0192711 A1* | 7/2009 | Tang | E21B 47/12 702/6 |
| 2011/0174490 A1* | 7/2011 | Taylor | E21B 28/00 166/308.1 |
| 2012/0001776 A1 | 1/2012 | Yu et al. | |
| 2012/0272724 A1 | 11/2012 | Hollmann et al. | |
| 2012/0321209 A1* | 12/2012 | Le | G01V 3/20 382/250 |
| 2014/0286538 A1 | 9/2014 | Yu et al. | |

OTHER PUBLICATIONS

Examination Report 94(3) EPC issued in corresponding EP application 14773382.8 dated Nov. 21, 2016. 7 pages.

* cited by examiner

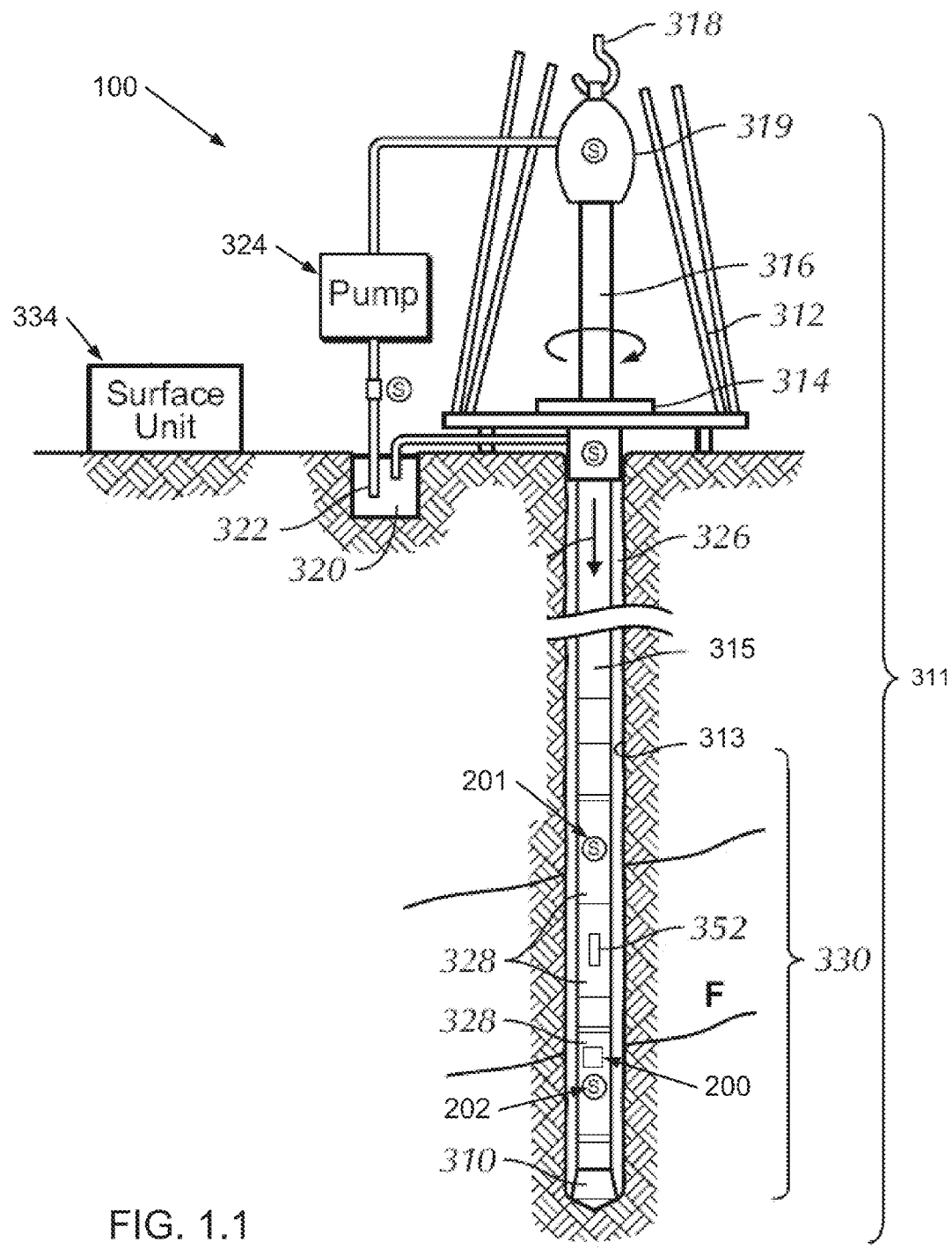
FIG. 1.1

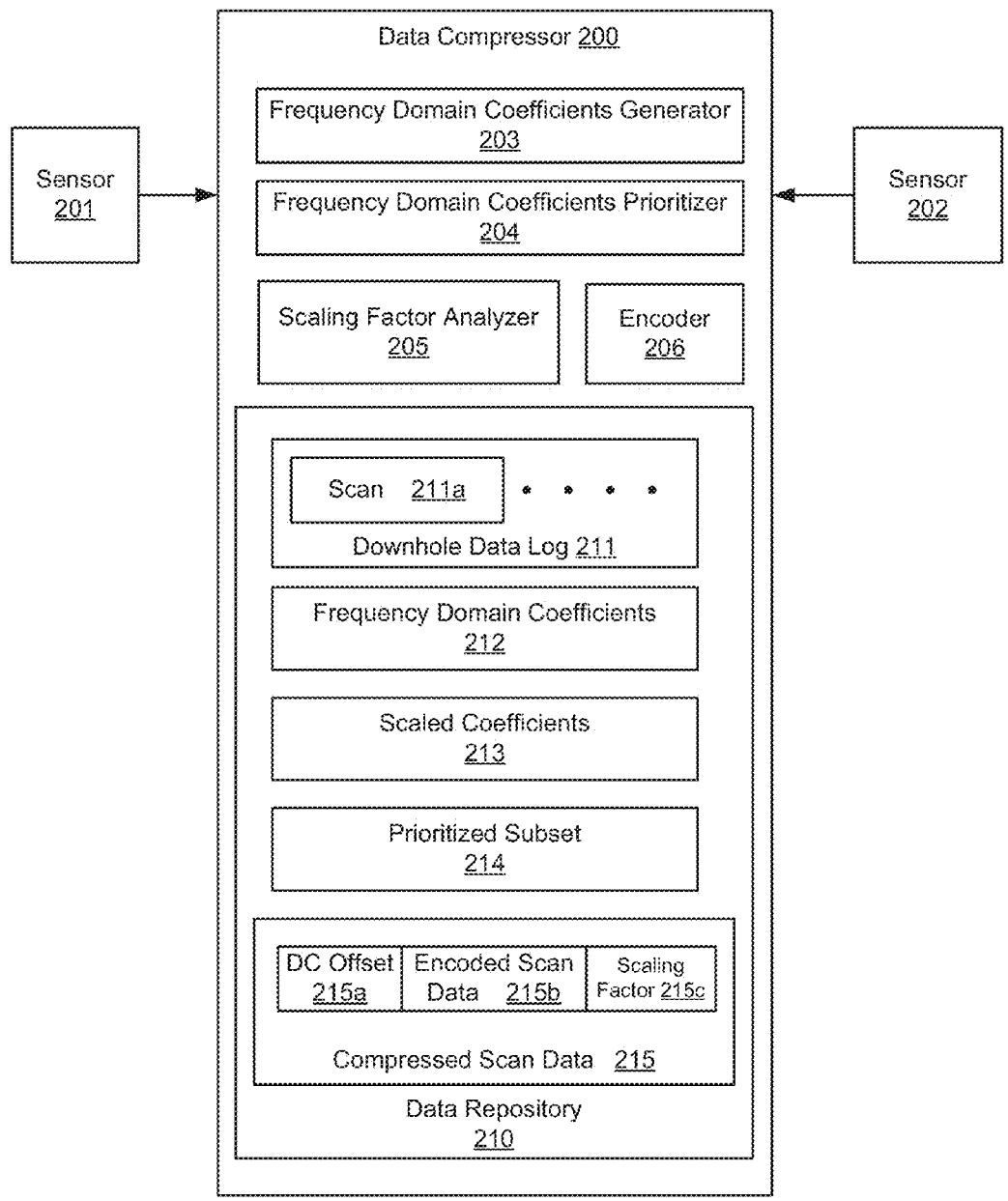
FIG. 1.2

LWD REAL-TIME BOREHOLE IMAGE TRANSMISSION

RELATED APPLICATIONS

This application is a Continuation of co-pending, commonly-invented, and commonly-assigned U.S. patent application Ser. No. 13/850,243, filed Mar. 25, 2013, and entitled LWD Real-Time Borehole Image Transmission.

BACKGROUND

The logging-while drilling (LWD) borehole images are generated from the azimuthal measurements provided by the LWD tools as the tools rotate inside the borehole during the drilling process. The image measurements are normally binned into a number (denoted as "N") of azimuthal sectors; with the value of each sector corresponding to the tool reading at an azimuth direction, and the total N sectors covers the 360-degree full azimuth of the borehole. The sector measurements are obtained periodically (e.g., increments of five, ten, or twenty seconds etc.) and the measurements during one time interval are collectively referred to as one scan, which is an N-bin waveform. The LWD borehole image is a collection of such scans. The image may be presented in depth indices by merging and converting the time-indexed scans to the depth domain.

The borehole images contain abundant geological structural information and the drilling induced borehole condition information. The information include, formation beddings, well trajectory dip angles, faults, tool standoffs, wash-out, corkscrew borehole, natural fractures or drilling induced stress or fractures, etc. Such information is used for the driller to make well-placement decision in real-time. Transmission of the images in real-time using the mud-pulse telemetry is challenging due to limited telemetry speed, such as 1.0 to 12.0 bps and limited bandwidth allocation to image transmission, such as less than 2.0 bps. In deeper wells such as the extended reach drilling (ERD) services, the mud pulse signal becomes weaker resulting in even slower telemetry speed (1.0~3.0 bps or lower). Accordingly, large-scale compression is required. The existing image compression algorithms currently used by the imaging tools such as EcoScope, geoVision Resistivity (GVR), and Azimuthal Density Neutron adnVision tools are two types of the JPEG-style two-dimensional (2D) discrete cosine transform (DCT) based compression. The images produced by the EcoScope and the ADN tools are 16-bin low azimuth-resolution image including density image, gamma-ray image, PE (photo-electric factor) image, density and ultrasonic caliper images. For such images the existing JPEG algorithm used by the EcoScope and ADN tools is less efficient because of a number of reasons described below.

1) The existing JPEG algorithm is 2-D compression requiring a 160-second image block to be transmitted in 160 seconds by eighteen 8-bit transmission data packages (commonly referred to as DPOINTs). If the user places more than eighteen DPOINTs for 160 seconds, the image will not be ready for transmission at the 19th DPOINT and therefore, the bandwidth will be wasted by sending hand-shaking signals. If the user places less than eighteen DPOINTs for 160 seconds, transmission is not able to catch up to the image acquisition speed and as the result, gaps will be observed between two compression blocks. This is not user friendly.

2) The existing JPEG algorithm does not allow the user to adjust recovered image quality based on particular data quality requirement, or the rate of penetration (ROP).

3) The information rate of the existing JPEG algorithm is low. Among the eighteen DPOINTs, seven DPOINTs are overhead used for hand-shaking or error correction. The information rate is 61%.

4) The new version of the JPEG compression, referred to as the multi-mode image compression used by the GVR4 (MicroScope) lateral resistivity image uses a large amount of design and implementation effort and tremendous downhole tool computation resource (e.g., memory, CPU, etc).

SUMMARY

In general, in one aspect, embodiments relate to data transmission from a bottom hole assembly (BHA). A scan is obtained from multiple scans forming a downhole data log of a borehole within a subterranean formation. The scan includes a sequence of data items from a sensor in the BHA located in the borehole. Each data item corresponds to an azimuth angle of the sensor. Further, compressed scan data is generated from the sequence of data items on a per-scan basis, and transmitted, using a pre-determined borehole telemetry, to a surface unit.

Other aspects of the invention will be apparent from the following detailed description and the appended claims.

BRIEF DESCRIPTION OF DRAWINGS

The appended drawings illustrate several embodiments of LWD real-time borehole image transmission and are not to be considered limiting of its scope, for LWD real-time borehole image transmission may admit to other equally effective embodiments.

FIG. 1.1 is a schematic view of a wellsite depicting a drilling operation in which one or more embodiments of LWD real-time borehole image transmission may be implemented.

FIG. 1.2 shows a system using LWD real-time borehole image transmission in accordance with one or more embodiments.

DETAILED DESCRIPTION

Figure 2:
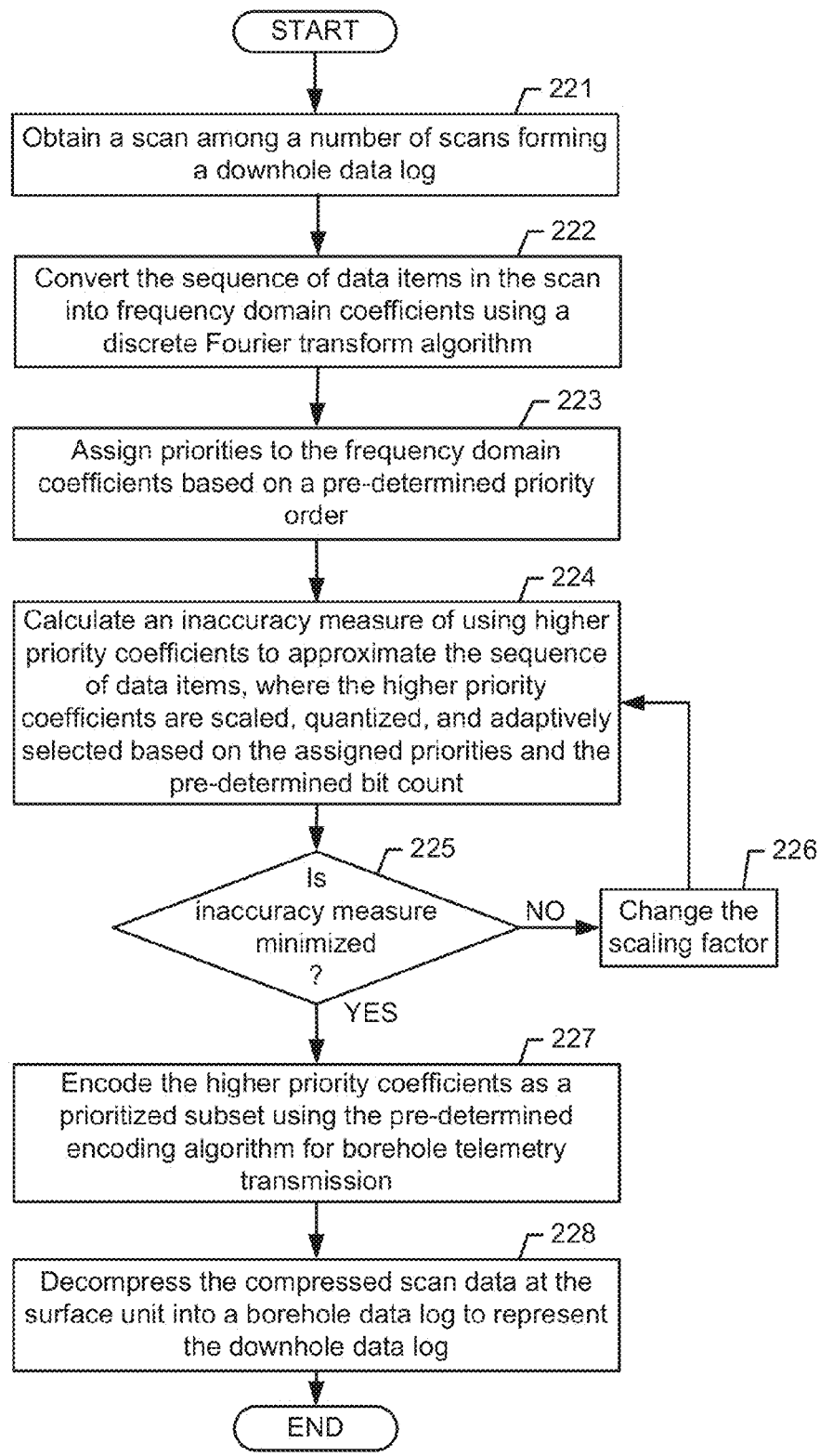
FIG. 2 depicts an example flowchart using LWD real-time borehole image transmission in accordance with one or more embodiments.

Aspects of the present disclosure are shown in the above-identified drawings and described below. In the description, like or identical reference numerals are used to identify common or similar elements. The drawings are not necessarily to scale and certain features may be shown exaggerated in scale or in schematic in the interest of clarity and conciseness.

Aspects of the present disclosure include a method, system, and computer readable medium to perform lossy compression optimized for transmission of the low-azimuth-resolution borehole images using the mud-pulse telemetry. The applicable images include bulk density image, gamma-ray image, photo-electric factor image, borehole caliper images, etc. The compression is applied scan-by-scan on the acquired image waveforms in the downhole LWD tools and the image is reconstructed from the decompressed waveform at the surface. In one or more embodiments, the lossy compression of the present disclosure is performed using four major components of a data compressor: a frequency domain coefficients generator to perform Discrete Fourier Transform (DFT), a frequency domain coefficients prioritizer to select high priority coefficients, a scaling factor analyzer to perform adaptive quantization, and an encoder to perform entropy encoding. The lossy compression compresses the 16-bin waveform into 26 bits.

More specifically, in one or more embodiments, the lossy compression of the present disclosure is a Fourier-transform-based compression. After the LWD tool acquires a scan of an image waveform in downhole, the data compressor applies a preprocessing procedure to filter out the measurement noise and normalize the data to the predefined data range. The filtered waveform is then transferred to the frequency domain using Discrete Fourier Transform (DFT). The frequency domain components with larger amplitude are called high priority coefficients. By analyzing the power spectrum, the data compressor may select a list of the most high priority coefficients that can possibly be included in the available bandwidth. The selected coefficients will be quantized using the adaptive quantization scheme and encoded by a Huffman encoder. The final compressed result becomes a 26-bit bit-stream to be transmitted to the surface using one or two DPOINTS (depending on the maximum number of bits allowed by the DPOINT definition).

The lossy compression of the present disclosure allows the user to send the waveforms at flexible update rates based on the available bandwidth, drilling speed, and pre-determined image quality requirements. Further, it does not require any bandwidth overhead on precursors and error correction. Compared to the JPEG algorithm used by the aforementioned EcoScope and the ADN tool, the lossy compression of the present disclosure has advantages in both recovered image quality and usability. In one or more embodiments, the decompression is a reversed process of the compression procedure described above.

FIG. 1.1 is a schematic view of a wellsite (100) depicting a drilling operation. The wellsite (100) includes a drilling system (311) and a surface unit (334). In the illustrated embodiment, a borehole (313) is formed by rotary drilling in a manner that is well known. Those of ordinary skill in the art given the benefit of this disclosure will appreciate, however, that LWD real-time borehole image transmission as disclosed herein may also be used in drilling applications other than conventional rotary drilling (e.g., mud-motor based directional drilling), and is not limited to land-based rigs.

The drilling system (311) includes a drill string (315) suspended within the borehole (313) with a drill bit (310) at its lower end. The drilling system (311) also includes the land-based platform and derrick assembly (312) positioned over the borehole (313) penetrating a subterranean formation (F). The assembly (312) includes a rotary table (314), kelly (316), hook (318) and rotary swivel (319). The drill string (315) is rotated by the rotary table (314), energized by means not shown, which engages the kelly (316) at the upper end of the drill string. The drill string (315) is suspended from hook (318), attached to a traveling block (also not shown), through the kelly (316) and a rotary swivel (319) which permits rotation of the drill string relative to the hook.

The drilling system (311) further includes drilling fluid or mud (320) stored in a pit (322) formed at the well site. A pump (324) delivers the drilling fluid (320) to the interior of the drill string (315) via a port in the swivel (319), inducing the drilling fluid to flow downwardly through the drill string (315) as indicated by the directional arrow. The drilling fluid (320) exits the drill string (315) via ports in the drill bit (310), and then circulates upwardly through the region between the outside of the drill string (315) and the wall of the borehole (313), called the annulus (326). In this manner, the drilling fluid (320) lubricates the drill bit (310) and carries formation cuttings up to the surface as it is returned to the pit (322) for recirculation.

The drill string (315) further includes a bottom hole assembly (BHA) (330), near the drill bit (310). In other words, the BHA may be located within several drill collar lengths from the drill bit. The BHA (330) includes capabilities for measuring, processing, and storing information, as well as communicating with the surface unit (334). The BHA (330) further includes drill collars (328) for performing various other measurement functions. In one or more embodiments, the BHA (330) includes the data compressor (200). In one or more embodiments, a portion of the data compressor (200), or any component contained therein, may also be included in the surface unit (334).

Sensors (S) are located about the wellsite to collect data, which may be in real time, concerning the operation of the wellsite, as well as conditions at the wellsite. The sensors (S) may also have features or capabilities, of monitors, such as cameras (not shown), to provide pictures of the operation. Surface sensors or gauges (S) may be deployed about the surface systems to provide information about the surface unit, such as standpipe pressure, hook load, depth, surface torque, rotary rotations per minute (rpm), among others. Downhole sensors or gauges (S) are disposed about the drilling tool and/or wellbore to provide information about downhole conditions, such as wellbore pressure, weight on bit, torque on bit, direction, inclination, collar rpm, tool temperature, annular temperature and toolface (i.e., angle of a tool), among others. Multiple downhole sensors (S) may be located at different positions on BHA (330), such as sensor (201) and sensor (202). In one or more embodiments, sensor (201) and sensor (202) may be configured to capture a density image, gamma-ray image, photo-electric factor image, borehole caliper images, etc. The information collected by the sensors is conveyed to the various parts of the drilling system and/or the surface unit (334).

The BHA (330) and surface unit (334) may include a data compressor (shown in FIG. 1.2) and a corresponding data decompressor, respectively. For example, the data compressor (200) may be located on the BHA (330), while the corresponding data decompressor (not shown) may be located on the surface unit (334). In one or more embodiments, all or a portion of the corresponding data decompressor (not shown) may be located in a remote location from the oilfield. The data compressor (200) includes functionality to compress the output image(s) of the sensor (201) and sensor (202) for data transmission using mud-pulse telemetry. The data compressor (200) is discussed in further detail below with respect to FIG. 1.2.

Continuing with FIG. 1.1, the drilling system (311) is operatively connected to the surface unit (334) for communication therewith. The BHA (330) is provided with a communication subassembly (352) that communicates with the surface unit (334). The communication subassembly (352) is adapted to send signals to and receive signals from the surface using mud pulse telemetry. The communication subassembly (352) may include, for example, a transmitter that generates a signal, such as an acoustic or electromagnetic signal, which is representative of the measured drilling parameters. It will be appreciated by one of skill in the art that a variety of telemetry systems may be employed, such as mud pulse telemetry, wired drill pipe, electromagnetic or other known telemetry systems.

In one or more embodiments, the wellbore is drilled according to a drilling plan that is established prior to drilling. The drilling plan may set forth equipment, pressures, trajectories and/or other parameters that define the drilling process for the wellsite. The drilling operation may then be performed according to the drilling plan. However, as information is gathered, the drilling operation may deviate from the drilling plan. Additionally, as drilling or other operations are performed, the subsurface conditions may change. The earth model may also be adjusted as new information is collected. Such information may include results generated by the data compressor (200) that are used to identify corrective actions to address a drilling event. For example, the drilling plan may be adjusted based on the calculated inclination and azimuth.

The subterranean assets are not limited to hydrocarbons such as oil, throughout this document, the terms "oilfield" and "oilfield operation" may be used interchangeably with the terms "field" and "field operation" to refer to a site where any type of valuable fluids can be found and the activities for extracting them. The terms may also refer to sites where substances are deposited or stored by injecting them into the surface using boreholes and the operations associated with this process. Further, the term "field operation" refers to a field operation associated with a field, including activities related to field planning, wellbore drilling, wellbore completion, and/or production using the wellbore.

FIG. 1.2 shows more details of the data compressor (200) depicted in FIG. 1.1. As shown in FIG. 1.2, the data compressor (200) includes a frequency domain coefficients generator (203), a frequency domain coefficients prioritizer (204), a scaling factor analyzer (205), an encoder (206), and a data repository (210) storing various data used or generated by the frequency domain coefficients generator (203), the frequency domain coefficients prioritizer (204), the scaling factor analyzer (205), and the encoder (206). For example, the frequency domain coefficients (212) is generated by the frequency domain coefficients generator (203) from the downhole data log (211). The scaled coefficients (213) are generated by the scaling factor analyzer (205). The prioritized subset (214) is generated by the frequency domain coefficients prioritizer (204). The encoded scan data (215b) is generated by the encoder (206). In one or more embodiments, one or more of the modules and elements shown in FIG. 1.2 may be omitted, repeated, and/or substituted. Accordingly, embodiments of LWD real-time borehole image transmission should not be considered limited to the specific arrangements of modules shown in FIG. 1.2.

In one or more embodiments, the data repository (210) is any type of storage unit and/or device (e.g., a file system, database, collection of tables, or any other storage mechanism) for storing data. Further, the data repository (210) may include multiple different storage units and/or devices. The multiple different storage units and/or devices may or may not be of the same type or located at the same physical site. For example, a portion of the data repository (210) may be located on the BHA (330) while another portion may be located at the surface unit (334).

In one or more embodiments, the data compressor (200) corresponds to hardware, software, or a combination thereof. In one or more embodiments, the data compressor (200) is configured to compress, on a per scan basis, the downhole data log (211) of the borehole (313) within the subterranean formation (F) to generate a number of compressed scan data (e.g., compressed scan data (215)). In particular, the downhole data log (211) is compressed in a manner so that information contained therein can be transmitted effectively to the surface unit (334) or other surface location using pre-determined borehole telemetry. In one or more embodiments, the compressed scan data (e.g., compressed scan data (215)) is generated for each scan (e.g., scan (211a) to fit within the size limitation of a single DPOINT. In one or more embodiments, the compressed scan data (e.g., compressed scan data (215)) is generated for each scan (e.g., scan (211a)) to fit within a pre-determined number of DPOINTs. In one or more embodiments, the downhole data log (211) may contain a bulk density image, gamma-ray image, photo-electric factor image, borehole caliper image, or other types of images. Further, the pre-determined borehole telemetry may be the mud-pulse telemetry.

In one or more embodiments, the data compressor (200) includes a frequency domain coefficients generator (203) that is configured to generate the frequency domain coefficients (212) from the downhole data log (211) on a per scan basis. The frequency domain coefficients generator (203) first obtains a scan (e.g., scan (211a), also referred to as a waveform or a curve) among multiple scans forming the downhole data log (211). Specifically, the scan (211a) includes a sequence of data items (also referred to as bins or samples) from a sensor (e.g., sensor (201), sensor (202)) in the BHA (330) located in the borehole (313). In particular, each data item corresponds to an azimuth angle of the sensor (e.g., sensor (201), sensor (202)) when the data item is captured. For example, the orientation of the sensor (e.g., sensor (201), sensor (202)) may be rotated around an axial direction of the borehole (313) through a pre-determined angular range (e.g., 360 degrees, one revolution, half revolution, one and half revolution, two revolutions, etc.) to capture a scan.

In addition, the frequency domain coefficients generator (203) is further configured to convert the sequence of data items in the scan (211a) into the frequency domain coefficients (212) using a discrete Fourier transform (DFT) algorithm. For example, a DFT algorithm known to those skilled in the art may be used to convert an alternating portion of the scan (211a). In one or more embodiments, converting the sequence of data items in the scan (211a) includes subtracting an average value (i.e., DC offset (215a)) of the sequence of data items from each data item to generate a sequence of adjusted data items (not shown), and performing the DFT algorithm on the sequence of adjusted data items (i.e., the alternating portion of the scan (211a)) to generate the frequency domain coefficients (212). In one or more embodiments, the DC offset (215a) (i.e., the average value of the sequence of data items) is later included in the compressed scan data (215). Additional details of the operations performed by the frequency domain coefficients generator (203) are described in reference to FIG. 2 below.

In one or more embodiments, the data compressor (200) includes a frequency domain coefficients prioritizer (204) that is configured to generate the scaled coefficients (213) by scaling the frequency domain coefficients (212) based on an adaptively determined scaling factor (shown as scaling factor (215c) included as part of the compressed scan data (215)). Further, a prioritized subset (214) is extracted from the scaled coefficients (213) to ensure that a number of bits generated from encoding the prioritized subset (214) using a pre-determined encoding algorithm is less than a predetermined bit count. In one or more embodiments, Huffman encoding algorithm or other variable length entropy encoding algorithm may be used. In one or more embodiments, the pre-determined bit count is limited to fit within a single borehole telemetry transmission data package (commonly referred to as DPOINT) or other pre-determined number of DPOINTs. For example, a single DPOINT may allow 26 bits for the encoded bits. In one or more embodiments, each coefficient in the scaled coefficients (213) is assigned a priority based on an empirical priority order associated with the scaled coefficients (213). In particular, the prioritized subset (214) is extracted from the scaled coefficients (213) by discarding, as dictated by the DPOINT limitation, lower priority coefficients according to the empirical priority order. In one or more embodiments, the empirical priority order is specific to a type of the downhole data log (211), such as a bulk density image, a gamma-ray image, a photo-electric factor image, and a borehole caliper image. Although the scaling operation is performed prior to the prioritizing/extraction operation in the description above, the scaling, prioritizing, and extraction operations may also be performed in different order than the description above without deviating from the scope of the present disclosure.

In one or more embodiments, the frequency domain coefficients prioritizer (204) is further configured to identify the pre-determined bit count based on a data item count of the sequence of data items in the scan (211a) and an allocation of bandwidth of the pre-determined borehole telemetry for transmitting the compressed scan data (215).

In one or more embodiments, the frequency domain coefficients prioritizer (204) is further configured to determine a frequency dependent portion of the aforementioned adaptively determined scaling factor (referred to as frequency dependent portion) and a scan dependent portion of the aforementioned adaptively determined scaling factor (referred to as scan dependent portion). In one or more embodiments, the scan dependent portion is determined separately for each scan to minimize the inaccuracy (e.g., due to quantization) of using the prioritized subset (214) to represent the scan (211a). In one or more embodiments, the frequency dependent priority is pre-determined based on a type of the downhole data log (211). As noted above, the type may be one of a bulk density image, a gamma-ray image, a photo-electric factor image, and a borehole caliper image.

Additional details of the operations performed by the frequency domain coefficients prioritizer (204) are described in reference to FIG. 2 below.

In one or more embodiments, the data compressor (200) includes the scaling factor analyzer (205) that is configured to calculate an inaccuracy measure representing an inaccuracy of data value in using the prioritized subset (214) to approximate the sequence of data items in the scan (211a); and to determine the aforementioned adaptively determined scaling factor (shown as scaling factor (215c) included as part of the compressed scan data (215)) to minimize the inaccuracy measure. As described above, the adaptively determined scaling factor (shown as scaling factor (215c) included as part of the compressed scan data (215)) is used by the frequency domain coefficients prioritizer (204) to scale the frequency domain coefficients (212).

In one or more embodiments, the scaling factor analyzer (205) is further configured to determine a scan dependent portion of the adaptively determined scaling factor (shown as scaling factor (215c) included as part of the compressed scan data (215)), where the scan dependent portion is determined separately for each scan to minimize the inaccuracy measure. In one or more embodiments, the scan dependent portion (shown as scaling factor (215c)) is included in the compressed scan data (215).

In one or more embodiments, the scaling factor analyzer (205) is further configured to determine a frequency dependent portion of the adaptively determined scaling factor (shown as scaling factor (215c) included as part of the compressed scan data (215)), where the frequency dependent portion scales each frequency domain coefficient of the frequency domain coefficients (212) separately based on a corresponding frequency. In one or more embodiments, the frequency dependent portion is pre-determined based on a type of the downhole data log, such as a bulk density image, a gamma-ray image, a photo-electric factor image, a borehole caliper image, or other type of image. In one or more embodiments, the frequency domain coefficients (212) are quantized based on pre-determined quantization thresholds subsequent to being scaled using the frequency dependent portion. Additional details of the operations performed by the scaling factor analyzer (205) are described in reference to FIG. 2 below.

In one or more embodiments, the data compressor (200) includes the encoder (206) that is configured to encode the prioritized subset (214) using the aforementioned pre-determined encoding algorithm to generate encoded scan data (215b) that is included as part of the compressed scan data (215). For example, as noted above, Huffman encoding algorithm or other entropy encoding algorithm known to those skilled in the art may be used. Accordingly, the compressed scan data (215) is sent to a transmitter of the aforementioned pre-determined borehole telemetry, such as a mud-pulse telemetry transmitter, for transmitting the compressed scan data (215) to the surface unit (334).

In one or more embodiments, generating the compressed scan data (215) is initiated in real-time prior to obtaining another scan in the downhole data log (211) that is subsequent and adjacent to the scan (211a). In one or more embodiments, transmitting the compressed scan data (215) is initiated in real-time prior to generation completion of another compressed scan data of the another scan.

In one or more embodiments, the compressed scan data (215) is decompressed at the surface unit (334) into a borehole data log to represent the downhole data log (211). Accordingly, a field operation is performed based on the borehole data log. In one or more embodiments, the field operation includes activities related to field planning, wellbore drilling, wellbore completion, and/or production using the wellbore. Additional details of the operations performed by the encoder (206) are described in reference to FIG. 2 below.

FIG. 2 depicts an example flowchart of LWD real-time borehole image transmission in accordance with one or more embodiments. For example, the method depicted in FIG. 2 may be practiced using the data compressor (200) described in reference to FIGS. 1.1 and 1.2 above. In one or more embodiments, one or more of the elements shown in FIG. 2 may be omitted, repeated, and/or performed in a different order. Accordingly, embodiments of LWD real-time borehole image transmission should not be considered limited to the specific arrangements of elements shown in FIG. 2.

In one or more embodiments, the method depicted in FIG. 2 is practiced to compress, on a per scan basis, a downhole data log of a borehole within a subterranean formation to generate a number of compressed scan data. In particular, the downhole data log is compressed in a manner so that information contained therein can be transmitted effectively to a surface unit or other surface location using pre-determined borehole telemetry. In one or more embodiments, the compressed scan data (e.g., compressed scan data (215) shown in FIG. 1.2) is generated for each scan (e.g., scan (211a) shown in FIG. 1.2, also referred to as a waveform or a curve) to fit within the size limitation of a single DPOINT. In one or more embodiments, the compressed scan data is generated for each scan to fit within a pre-determined number of DPOINTs. In one or more embodiments, the downhole data log may contain a bulk density image, gamma-ray image, photo-electric factor image, borehole caliper image, or other types of images. Further, the pre-determined borehole telemetry may be the mud-pulse telemetry. In one or more embodiments, the compressed scan data is decompressed at the surface unit into a borehole data log to represent the downhole data log.

Initially in Block 221, a scan (e.g., scan (211a) shown in FIG. 1.2) in the downhole data log is obtained. In one or more embodiments, the scan is one of multiple scans forming the downhole data log. Specifically, the scan includes a sequence of data items (also referred to as bins or samples) from a sensor located on a BHA in the borehole. In particular, each data item corresponds to an azimuth angle of the sensor when the data item is captured. For example, the orientation of the sensor rotates around an axial direction of the borehole through a pre-determined angular range (e.g., 90 degrees, 180 degree, 270 degrees, 360 degrees, one revolution, half revolution, one and half revolution, two revolutions, or any number of degrees/revolutions) to capture a scan.

As noted above, the downhole data log is compressed on the per scan basis. In other words, the scans in the downhole data log are compressed independent of each other. In other words, in one or more embodiments, a scan may be compressed using information contained in the scan itself without any dependency on information contained in any other scan of the downhole data log. In one or more embodiments, generating the compressed scan data for a scan is initiated in real-time prior to obtaining another scan that is subsequent and adjacent to the scan being compressed. In one or more embodiments, transmitting the compressed scan data for the scan is initiated in real-time prior to generation completion of another compressed scan data of the another scan.

In one or more embodiments, Block 221 is performed using the frequency domain coefficients generator (203) in conjunction with the sensor (201) and/or sensor (202) depicted in FIG. 1.2 above.

In Block 222, the sequence of data items in the scan is converted into a number of frequency domain coefficients (e.g., frequency domain coefficients (212) shown in FIG. 1.2)) using a discrete Fourier transform (DFT) algorithm. In one or more embodiments, the conversion is preceded by data preparation operations. For example, the data preparation may include one or more of pre-processing, filtering, normalization, DC calculation, quantization, and/or encoding operation. Examples of these operations are described in detail below.

The pre-processing operation includes noise filtering and normalization. In one or more embodiments, the operation involves five parameters, shown as pseudo-code in TABLE 1 below.

TABLE 1

Pre-Processing Parameters for Density Image Compression ppAlg = 0;
   Note:
      The parameter defines the type of normalization
      conversion:
         0 - Linear
         1 - SQRT
         2 - LOG10 (10-based Logarithm)
         3 - LN (Natural Logarithm)
ppParam = [1, 0, 3.44, 0.5];
   Note:
      The coefficients in the array from left to right are:
         ppParam(1) - Normalization Gain
         ppParam(2) - Normalization Offset
         ppParam(3) - Max Value of the Expected Input
         ppParam(4) - Min Value of the Expected Input From time to time, a scan may exhibit a noisy waveform, resulting in one or more samples (i.e., data items) being corrupted or contain data value outside of an expected data range. For example, the noise may be due to measurement sensitivity, borehole instability, stick-slip, electronic noise, etc. In one or more embodiments, the noisy samples are filtered out using linear interpolation technique following one or more of the rules below:

(i) A sample in the scan (also referred to as a waveform or a curve), with a value outside the data range given by ppParam(3) and ppParam(4), is regarded as a "bad sample" and removed by the filter.

(ii) The "bad sample(s)" are replaced by linearly interpolated values based on two closest "good samples" to the left and the right of the "bad sample(s)".

(iii) When "bad sample(s)" are present at the beginning or the end of the waveform, circular interpolation is applied, i.e., "bad sample(s)" are replaced by the values linearly interpolated from the first and the last "good samples" in the waveform.

(iv) When a single sample is "good", the BHA tool may be considered to be sliding. The good value is copied to the rest of the bins.

(v) When all of the samples are bad with only a single sample above the value of ppParam(3) and the rest of the samples smaller or equal to zero, the BHA tool may be considered to be sliding. The sample above ppParam(3) is copied to the rest of the bins.

(vi) When all of samples are bad with multiple samples above the value of ppParam(3), the samples are to be truncated at the limits, i.e., the samples above the value of ppParam(3) are truncated to ppParam(3), and the samples below ppParam(4) is truncated to ppParam(4).

Following the filtering operation, the samples (i.e., data items) are normalized to a standard data range. In one or more embodiments, the normalization operation is parameterized by three predefined parameters, given by ppAlg, ppParam(1) and ppParam(2) in TABLE 1 above.

In one or more embodiments, when the compressed scan data is decompressed at the surface unit, de-normalization operation is performed using the inverse DFT to convert the compressed scan data back to the data range specified by ppParam(3) and ppParam(4). The de-normalization may be an inverse process of the normalization process.

TABLES 2 and 3 show an example normalization algorithm and an example de-normalization algorithm, respectively.

TABLE 2

Normalization (Compression)

```
a = ppParam(1);
b = ppParam(2);
X_i: Filtered input data
Y_i: Normalized data
switch ppAlg
    case 1
        Y_i = a *sqrt(X_i) + b;
    case 2
        Y_i = a *log10(X_i) + b;
    case 3
        Y_i = a *LN(X_i) + b;
    otherwise
        Y_i = a * X_i + b;
end
```

TABLE 3

De-Normalization (Decompression)

```
a = ppParam(1);
b = ppParam(2);
Y'_i: Normalized data
Z_i: De-Normalized data
switch ppAlg
    case 1
        Z_i = ((Y'_i −b)/a).^2;
    case 2
        Z_i = 10.^(( Y'_i −b)/a);
    case 3
        Z_i = exp.^(( Y'_i −b)/a);
    otherwise
        Z_i = (Y'_i − b)/a;
end
```

Normalization may be performed for the type of measurement that frequently presents a large dynamic data range within a waveform. In one or more embodiments, for the type of measurement that normalization is not needed, the corresponding gain and offset parameters are set to 1 and 0, respectively.

DC calculation, quantization, and encoding operations are described in the example below.

For a given waveform of 16 bins:

$$x(n) = x_0, x_1, \ldots x_{15} \quad (1)$$

The DC value is calculated first:

$$\bar{x} = \frac{\sum_{n=0}^{15} x_n}{16} \quad (2)$$

The DC value $\bar{x}$ is then quantized, encoded, and transmitted at the beginning of the compressed scan data, referred to as a bit stream. Correspondingly, the de-quantization is performed when the compressed scan data is decompressed at the surface unit. TABLES 4 and 5 show an example quantization algorithm and an example de-quantization algorithm, respectively.

TABLE 4

DC Quantization Parameters for Density Image Compression

```
% Quantization conversion algorithm 'dcQtAlg'
    0 - Linear
    1 - SQRT
```

TABLE 4-continued

DC Quantization Parameters for Density Image Compression

```
    2 - LOG10 (10-based Logarithm)
    3 - LN (Natural Logarithm)
dcQtAlg = 0;
% Number of bits used for quantization 'dcNumBits'
dcNumBits = 7;
% Quantization conversion parameters 'dcParam'
dcParam = [3.0, 1.2, 70.5556, −1.2];
    The coefficients in the array from left to right are:
    dcParam(0) - maximum value for dc.
    qtParam(1) - minimum value for dc.
    qtParam(2) - Conversion gain
    qtParam(3) - Conversion offset
```

TABLE 5

DC Quantization Parameters for Density Image Decompression

```
function [vout] = DCQuantization(val, dcParam)
    dcmax = dcParam(0);
    dcmin = dcParam(1);
    a = dcParam(2);
    b = dcParam(3);
    val = min([dcmax val]);
    val = max([dcmin val]);
    switch dcQtAlg
        case 1
            temp = a.*sqrt(val + b);
        case 2
            temp = a.*log10(val + b);
        case 3
            temp = a.*log(val + b);
        otherwise
            temp = a.*(val + b);
    end
    temp = round(temp);
    vout = temp;
```

In one or more embodiments, after being quantized, the DC value is encoded using an unsigned magnitude encoder. For example a quantized DC value of 79 is encoded as '1001111'. The coded dc bits are placed at the beginning of the bit stream of the compressed scan data.

In one or more embodiments, after the DC value is calculated, it is removed from the waveform, resulting in a dc-subtracted waveform:

$$y(n) = \{x_0, x_1, \ldots x_{15}\} - \bar{x} \quad (3)$$

The DFT is then applied to the waveform y(n):

$$Y(k) = \frac{1}{N} \sum_{n=0}^{N-1} y_n e^{-\frac{2\pi i}{N}kn} \quad (4)$$

where k=0, 1, . . . , N−1, is the frequency domain indices, and N is the length of the waveform. In one or more embodiments, N=15.

Since y(n) are real numbers, the DFT obeys the symmetry:

$$Y(k) = Y^*(N-k) \quad (5)$$

where the star denotes a complex conjugate. Therefore, the above DFT results are half redundant, i.e., the second half of the DFT coefficients can be derived from the first half of the coefficients. Due to the fact that the DC value is removed before applying the DFT, in the example where the waveform length 16 (when N=15) is an even number, there exists 15 independent real-number coefficients (referred to as AC coefficients) represented by the array "DFTArray" below:

DFTArray={Re(Y(1)), Im(Y(1)), Re(Y(2)), Im(Y(2)), Re(Y(3)), Im(Y(3)), Re(Y(4)), Im(Y(4)), Re(Y(5)), Im(Y(5)), Re(Y(6)), Im(Y(6)), Re(Y(7)), Im(Y(7)), Re(Y(8))} where Re and Im represent the real part and imaginary part, respectively of any real number y(n).

In one or more embodiments, these independent AC coefficients are stored in the DFTArray in the particular order above.

In one or more embodiments, Block 222 is performed using the frequency domain coefficients generator (203) depicted in FIG. 1.2 above.

In Block 223, each of the frequency domain coefficients is assigned a priority based on a pre-determined priority order. Generally, the compression quality is dependent on the energy distribution of the AC coefficients and borehole telemetry bandwidth imposed size limitation (i.e., DPOINT based limitation) of the compressed scan data. In one or more embodiments, a variable-length entropy encoder is used to generate the compressed scan data. In such embodiments, if all AC coefficients (i.e., the entire DFTArray) are used as input, the variable-length entropy encoder output bit count is a variable in one or more embodiments. In one or more embodiments, compression performance is enhanced by using a prioritized subset (e.g., prioritized subset (214) shown in FIG. 1.2), instead of all the AC coefficients, as input to the variable-length entropy encoder based on allocated bandwidth. For example, the AC coefficients are prioritized in the priority order before being inputted into the variable-length entropy encoder. The priority order defines which AC coefficients are included at the beginning of the encoder output bit stream and which AC coefficients come later and can be discarded to meet the DPOINT based size limitation. Accordingly, the bandwidth allocation is prioritized for the higher priority AC coefficients over the lower priority ones.

In one or more embodiments, the priority order is determined empirically and referred to as an empirical priority order. Specifically, the empirical priority order is determined by evaluating the statistical significance of each AC coefficient in the DFTArray using historical field data. The resultant empirical priority order is dependent on the type of borehole image contained in the borehole data log being compressed. As an example, the empirical priority order for density image is given below as the ZigZagOrder array:

ZigZagOrder={1 2 4 3 6 15 5 7 8 9 10 11 12 13 14} (6)

The elements in the ZigZagOrder array correspond to the indices of the DFTArray described above. In other words, the AC coefficients in the DFTArray are reordered before being inputted into the variable length entry encoder as the following:

Reordered DFTArray={Re(Y(1)), Im(Y(1)), Im(Y(2)), Re(Y(2)), Im(Y(3)), Re(Y(8)), Re(Y(3)), Re(Y(4)), Im(Y(4)), Re(Y(5)), Im(Y(5)), Re(Y(6)), Im(Y(6)), Re(Y(7)), Im(Y(7))}.

According to this empirical priority order, the lower priority AC coefficients are discarded when the variable length entry encoder output bit count reaches the DPOINT based limitation. In one or more embodiments, the lower priority AC coefficients are discarded in an adaptive manner by iterating through the Blocks 224, 225, and 226 as described below. The remaining higher priority AC coefficients are referred to as the prioritized subset of the AC coefficients (e.g., prioritized subset (214) shown in FIG. 1.2). As will be described later, the prioritized subset is encoded into the compressed scan data that satisfies the DPOINT based limitation.

Based on empirical result from evaluating a large amount of EcoScope and ADN image data, it is found that normally four or more higher priority AC coefficients from first ten are included in the compressed DPOINT(s) in order to make the recovered scan comparable to the corresponding recorded-mode version when the scan is displayed as image. In one or more embodiments, a coefficient selector is used to select the top four high priority coefficients from the first ten in the compressed DPOINT(s) and zero-off the less high priority ones at the positions lower than the four high priority coefficients. An example of the frequency domain coefficient selection scheme is shown below, note that the coefficients are placed in the zigzag order as the Reordered DFTArray.

TABLE 6

| Re(Y$_1$) | Im(Y$_1$) | Im(Y$_2$) | Re(Y$_2$) | Im(Y$_3$) | Re(Y$_3$) | Re(Y$_3$) | Re(Y$_4$) | Im(Y$_4$) | Re(Y$_5$) | Im(Y$_5$) |
|---|---|---|---|---|---|---|---|---|---|---|
| 5.57 | −5.49 | −5.46 | −0.37 | −1.52 | −0.29 | 0.32 | −1.36 | −2.85 | 1.03 | 0.66 |
| 5.57 | −5.49 | −5.46 | 0 | 0 | 0 | 0 | 0 | −2.85 | 1.03 | 0.66 |

| Re(Y$_6$) | Im(Y$_6$) | Re(Y$_7$) | Im(Y$_7$) |
|---|---|---|---|
| 0.37 | −0.30 | −0.12 | −0.39 |
| 0.37 | −0.30 | −0.12 | −0.39 |

In the example, let C(k) denote the kth coefficient in the ZigZagOrder array, where k=0, 1, . . . , 14. The top four high priority coefficients are at positions of k=0, 1, 2, 8, respectively. Attempting to include all of these high priority coefficients in the limited bandwidth, the selector sets the small coefficients at positions of 3, 4, 5, 6, and 7 to zero so as to save bandwidth for the high priority coefficient at the 8th position in the example. Other lower priority coefficients following the last high priority coefficients (at positions of k=9~14 in the example) are not zeroed-off because they might be included in the compression if bandwidth is still available after the high priority coefficients are encoded.

In one or more embodiments, Block 223 is performed using the frequency domain coefficients prioritizer (204) depicted in FIG. 1.2 above. Although the scaling, prioritizing, and extraction operations are performed in a particular order as described above, these operations may also be performed in a different order than described above without deviating from the scope of the present disclosure.

In Block 224, an inaccuracy measure is calculated to represent an inaccuracy of the compressed scan data due to using the higher priority AC coefficients to approximate all AC coefficients in the DFTArray. In one or more embodiments, the inaccuracy measure is calculated as a mean squared error (MSE) using a pre-determined algorithm. An example MSE calculation algorithm is described in detail below.

In this example, the MSE representing the inaccuracy measure is calculated as a mean squared difference between (i) higher priority AC coefficients after a scaling_quantization/de-quantization_scaling cycle and (ii) all original AC coefficients in the DFTArray. In one or more embodiments, an adaptive quantization and encoding scheme is used to apply optimized quantizers on the fly for each specific waveform. In other words, these quantizers are optimized for each scan separately. The scheme starts with a set of quantization seeds, which are the primitive quantities, statistically optimized to digitize the AC coefficients of the particular type of borehole image contained in the borehole data log. For each scan, an adaptive gain control (AGC) is used to "shrink" or "dilate" the quantizers by multiplying the quantization seeds using a scaling factor $g \in G$ (where G is a pre-determined sets of scaling factors, e.g., G=[0.5 1.0 2.0 4.0]). An optimum $\hat{g}$ is obtained by minimizing the MSE between a scaled_quantized/de-quantized_de-scaled subset of AC coefficients and the original AC coefficients. The optimum $\hat{g}$ and the quantization seeds are collectively referred to as an adaptively determined scaling factor.

To illustrate the quantization and encoding procedures, the following terms are defined:

C(k): the kth coefficient in the ZigZagOrder array, e.g., k=0, 1, . . . , 14.

$C^q(k)$: the scaled and quantized version of C(k).

$C^d(k)$: the de-quantized and de-scaled version of $C^q(k)$.

$C_{max}^q(k)$: a positive integer value defined for each C(k) to confine its quantized magnitude within a smaller range for encoding and bandwidth conservation, i.e., $|C^q(k)| \leq C_{max}^q(k)$. The value $C^q(k)$ is truncated if its magnitude exceeds $C_{max}^q(k)$. For this example, $C_{max}^q(k)$ is set to 3 for all AC coefficients.

S(k): quantization seed for C(k), also referred to as a frequency dependent portion of the adaptively determined scaling factor.

N(k): the number bits used to encode $C^q(k)$ using a pre-determined encoder, such as the Huffman encoder based on the Huffman cookbook shown in TABLE 7.

TABLE 7

| $C^q(k)$ | Codes | $C^q(k)$ | Codes |
|---|---|---|---|
| 0 | 0 | −1 | 100 |
|  |  | 1 | 101 |
| −2 | 1100 | −3 | 1110 |
| 2 | 1101 | 3 | 1111 |

Example scaling and quantization/de-quantization operations are shown below using 26 bits as the DPOINT limited bit count:

Loop through a) to d) below for each $g \in G$, a) Quantize C(k), k=0, . . . , 14, resulting in $$C^q(k) = \begin{cases} -\min\{\text{round}[|C(k) \cdot g \cdot S(k)|], C_{max}^q(k)\}, & C(k) < 0 \\ \min\{\text{round}[|C(k) \cdot g \cdot S(k)|], c_{max}^q(k)\}, & C(k) > 0 \end{cases} \quad (7)$$

b) Find the smallest integer $Q \leq 14$ so that $$\sum_{k=0}^{Q} N(k) \geq 26,$$

The scaled and quantized coefficients with k=0, . . . , Q are retained for the DPOINT bit stream of 26 bits during borehole telemetry transmission. In one or more embodiments, all $C^q(k)$ for k=0, . . . Q are collectively referred to as the prioritized subset.

c) De-quantize the Q coefficients selected in the previous step, resulting in $$C^d(k) = \begin{cases} C^q(k)/[g \cdot S(k)], & k \leq Q \\ 0, & k > Q \end{cases}, \quad (8)$$

d) Calculate the MSE (mean squared error) $\|\vec{C}^d - \vec{C}\|_2$, where $\vec{C}^d$ and $\vec{C}$ are vectors of $C^d(k)$ and C(k) for all k=0, . . . , 14, respectively. In other words, MSE is calculated as a mean squared difference between (i) higher priority AC coefficients after the scaling_quantization/de-quantization_scaling cycle and (ii) all original AC coefficients in the DFTArray.

In Block 225, a determination is made as to whether the inaccuracy measure (i.e., MSE) is minimized. If the determination is negative, i.e., the MSE is not yet minimized, the method returns to Block 224 via Block 226 where the scaling factor is changed. For example, by iterating through Blocks 224, 225, and 226, the MSE may be calculated for a pre-determined set of scaling factors, such as G=[0.5 1.0 2.0 4.0] to find the optimized scaling factor $\hat{g}$ (given in equation (9) below) resulting a minimum MSE.

$$\hat{g} = \underset{g \in G}{\arg\min} \left\| \vec{C}^d - \vec{C} \right\|_2, \quad (9)$$

If the determination in Block 225 is positive, i.e., the MSE is minimized, the method proceeds to Block 227 while the scaled and quantized coefficients $C^q(k)$ with k=0, . . . , Q corresponding to the optimum $\hat{g}$ are retained as the prioritized subset (e.g., prioritized subset (214) shown in FIG. 1.2). As noted above, the optimum $\hat{g}$ is determined for each scan separately based on specific data items in the scan. Accordingly, $\hat{g}$ is also referred to as the scan dependent portion of the adaptively determined scaling factor.

Further, in one or more embodiments, the aforementioned empirical priority order may also be determined using the MSE as a benchmark for evaluating different candidate priority orders. Specifically, for each candidate priority order, a statistical average of the MSE may be calculated using a large number of historical borehole data logs all containing the same particular type of borehole image. Accordingly, the particular candidate priority order that results in the minimum statistical average of the MSE over all candidate priority orders is selected as the empirical priority order for the particular type of borehole image.

Further, in one or more embodiments, the frequency dependent portion of the adaptively determined scaling factor (i.e., a set of quantization seeds S(k)) may also be determined using the MSE as a benchmark for evaluating different candidate sets of quantization seeds. Specifically, for each candidate set of quantization seeds, a statistical average of the MSE may be calculated using a large number of historical borehole data logs all containing the same particular type of borehole image. Accordingly, the particular candidate set of quantization seeds that result in the minimum statistical average of the MSE over all candidate sets of quantization seeds are selected as the set of quantization seeds S(k) for the particular type of borehole image.

In one or more embodiments, Blocks 224, 225, and 226 are performed using the scaling factor analyzer (205) in conjunction with the frequency domain coefficients prioritizer (204) depicted in FIG. 1.2 above.

In Block 227, the prioritized subset (e.g., prioritized subset (214) shown in FIG. 1.2) is encoded using the pre-determined encoder, such as the Huffman encoder or other variable length entropy encoders.

In one or more embodiments, the optimum $\hat{g}$ and the corresponding $C^q(k)$ of k=0, . . . , Q are encoded into a bit stream to generate the compressed scan data. For example, the value of $\hat{g}$ may be encoded into two bits shown in TABLE 8 below.

TABLE 8

| | Value of $\hat{g} = 2^j$ | | | |
|---|---|---|---|---|
| | 0.5 | 1 | 2 | 4 |
| Code ($\hat{j}$) | 11 | 00 | 01 | 10 |

In an example, the last coefficient $C^q(Q)$ is encoded by signed-magnitude encoding because the bits remaining for the last coefficient may not be enough to completely encode this coefficient due to the DPOINT based limitation. The singed-magnitude encoding allows a coefficient to be partially encoded and decoded. For example, a value −3 should be encoded as 111 in three bits, with the first bit being the sign bit. If there are only two bits left for the coefficient, the two bits may then encoded as 11, and is decoded as −2 by taking the missing bit as 0.

An example bit layout of the compression scan data is shown in TABLE 9 below.

TABLE 9

| Bit # | | | | | |
|---|---|---|---|---|---|
| 0 ~ 6 | 7 | 8 | 9 ~ | ? ~ 25 | |
| DC Value | AGC | Huffman encoder for the first 0 − (Q − 1) coeffients | | Asign-mag | |

In one or more embodiments, Block 227 is performed using the encoder (206) depicted in FIG. 1.2 above.

In Block 228, the compressed scan data is decompressed at the surface unit into a borehole data log to represent the downhole data log. In one or more embodiments, the decompression is performed to reverse the compression operations described in Blocks 222-227 above. In one or more embodiments, post-processing is performed during decompression to address a BHA tool sliding scenario. During sliding, the tool writes its reading to only one bin. For example, the EcoScope tool writes to bin 0 and the ADN tool writes to bin 8. During decompression, the sliding stage is recovered by the following scheme. When all the received AC coefficients are zero and the AGC value $\hat{g}$=1.0 (i.e., no amplification in scaling), the tool is considered as sliding. The DC value will be assigned to the specific bin and absent values will be assigned to the rest of the bins.

In one or more embodiments, borehole data logs containing different types of borehole images are compressed using the same compression and decompression algorithm described above. However, different types of borehole images are compressed using their own compression parameters. In other words, the empirical ZigZagOrder, quantization seed S(k), $C_{max}^q(k)$, and other compression parameters are customized for different image types, such as density images, PE images, and Gamma Ray images. As noted above, the downhole log of different types of images are compressed based on these customized empirical compression parameters before they are transmitted to the surface unit via borehole telemetry, such as mud-pulse telemetry.

Figure 3:
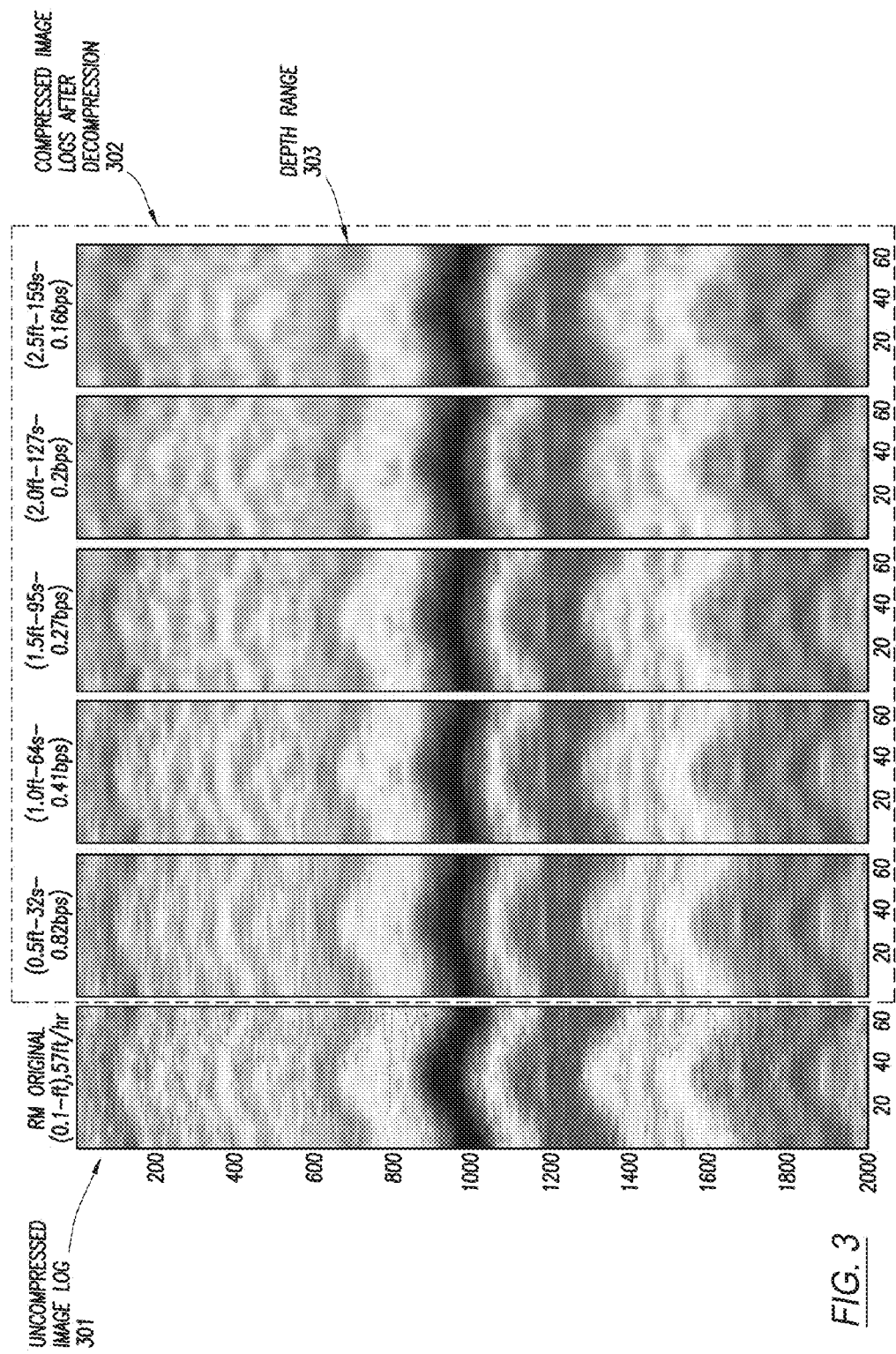
FIG. 3 depicts an example of using LWD real-time borehole image transmission in accordance with one or more embodiments.

FIG. 3 depicts an example of using LWD real-time borehole image transmission in accordance with one or more embodiments. Specifically, FIG. 3 shows an example black and white copy of Gamma-Ray image logs captured during drilling. The vertical axis in each column represents depth spanning a 2000 ft range and indexed in 0.1 ft. The horizontal axis in each column represents azimuth. The average rate of penetration during drilling is 57 ft/hr.

The first column to the left is the original uncompressed image log (301) captured downhole at 0.1 ft resolution. In other words, the original uncompressed image log in the first column includes one scan (shown as a horizontal segment) per 0.1 ft along the vertical axis. The other columns are compressed image logs after decompression (302) that are recovered at the surface. These other columns are shown at 0.5 ft, 1.0 ft, 1.5 ft, 2.0 ft, and 2.5 ft resolutions, respectively. In other words, the recovered image log in the $2^{nd}$ column from the left corresponds to one scan (i.e., decompressed from the compressed scan data and shown as a horizontal segment) transmitted via mud-pulse telemetry at 0.5 ft along the vertical axis, the recovered image log in the $3^{rd}$ column from the left corresponds to one scan transmitted via mud-pulse telemetry at 1.0 ft along the vertical axis, so on and so forth. As shown in FIG. 3, data samples in the decompressed scan data are converted from 16 bit data (typically rendered in color) to be shown in black and white. It is apparent from these images logs that any depth resolution of 0.1 ft through 2.5 ft is sufficiently high, compared to the total range of 2000 ft of the image log, such that individual scans (original or recovered) visually merge into a continuous 2D image in each of the columns. Further, the lossy compression/decompression processing preserves sufficient image details considering the limited borehole telemetry bandwidth. In particular within the depth range (303), these image logs include many features, although progressively degraded from left to right, are still visually identifiable even in the last column to the right with the least amount of borehole telemetry bandwidth allocation.

Figure 4:
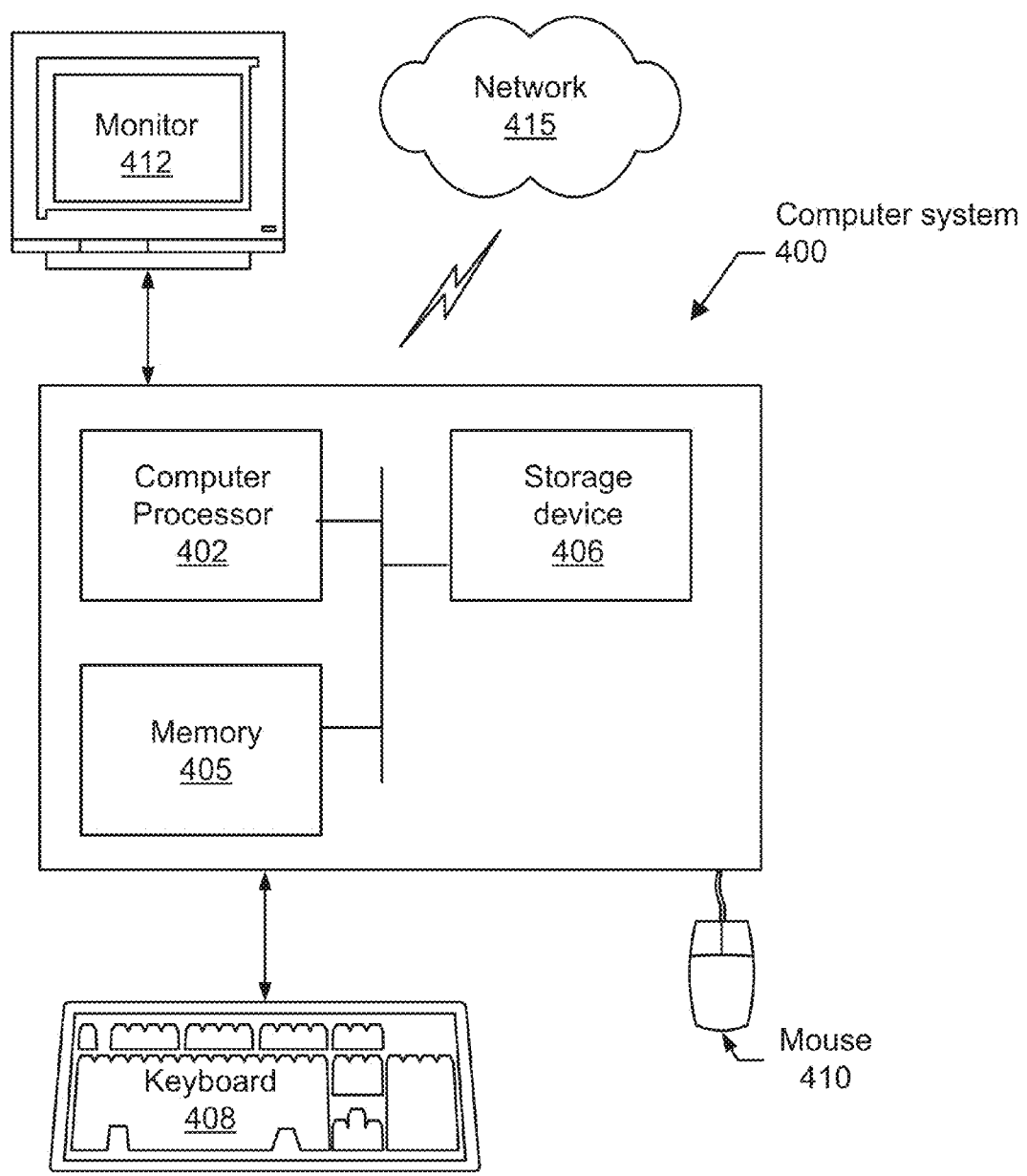
FIG. 4 depicts a computer system using which one or more embodiments of LWD real-time borehole image transmission may be implemented.

Embodiments of LWD real-time borehole image transmission may be implemented on virtually any type of computer regardless of the platform being used. For instance, as shown in FIG. 4, a computer system (400) includes one or more processor(s) (402) such as a central processing unit (CPU) or other hardware processor, associated memory (405) (e.g., random access memory (RAM), cache memory, flash memory, etc.), a storage device (406) (e.g., a hard disk, an optical drive such as a compact disk drive or digital video disk (DVD) drive, a flash memory stick, etc.), and numerous other elements and functionalities of today's computers (not shown). The computer (400) may also include input means, such as a keyboard (408), a mouse (410), or a microphone (not shown). Further, the computer (400) may include output means, such as a monitor (412) (e.g., a liquid crystal display LCD, a plasma display, or cathode ray tube (CRT) monitor). The computer system (400) may be connected to a network (415) (e.g., a local area network (LAN), a wide area network (WAN) such as the Internet, or any other similar type of network) via a network interface connection (not shown). Those skilled in the art will appreciate that many different types of computer systems exist (e.g., workstation, desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system (400) includes at least the minimal processing, input, and/or output means to practice one or more embodiments.

Further, those skilled in the art will appreciate that one or more elements of the aforementioned computer system (400) may be located at a remote location and connected to the other elements over a network. Further, one or more embodiments may be implemented on a distributed system having a plurality of nodes, where each portion of the implementation may be located on a different node within the distributed system. In one or more embodiments, the node corresponds to a computer system. In one or more embodiments, the node may correspond to a processor with associated physical memory. In one or more embodiments, the node may correspond to a processor with shared memory and/or resources. Further, software instructions to perform one or more embodiments may be stored on a computer readable medium such as a compact disc (CD), a diskette, a tape, or any other computer readable storage device.

Although the preceding description has been described herein with reference to particular means, materials and embodiments, it is not intended to be limited to the particulars disclosed herein; rather, it extends to all functionally equivalent structures, methods and uses, such as are within the scope of the appended claims.

What is claimed is:

1. A method for data transmission from a bottom hole assembly, comprising:
    (a) obtaining a scan among a plurality of scans forming a downhole data log of a borehole within a subterranean formation, wherein the scan comprises a sequence of data items from a sensor in the bottom hole assembly located in the borehole, wherein each data item corresponds to an azimuth angle of the sensor;
    (b) causing a downhole processor to convert the sequence of data items in the scan into a plurality of frequency domain coefficients using a transform algorithm;
    (c) assigning priorities to the frequency domain coefficients by evaluating a statistical significance of each of the frequency domain coefficients using historical field data;
    (d) iteratively discarding lower priority coefficients and retaining higher priority coefficients; and
    (e) transmitting the higher priority coefficients to a surface processor,
    wherein (b), (c), and (d) are initiated in real-time prior to obtaining another scan in (a) of the plurality of scans that is subsequent and adjacent to the scan.

2. The method of claim 1, further comprising:
    (f) continuously repeating (a), (b), (c), (d), and (e) for a plurality of subsequent scans of the plurality of scans that form the downhole data log.

3. The method of claim 1, further comprising:
    (f) causing the surface processor to convert the higher priority coefficients to decompressed data items that represent the scan obtained downhole in (a); and
    (g) performing a field operation based on at least the decompressed data items.

4. The method of claim 1, wherein (d) further comprises retaining at least four of the higher priority coefficients and discarding the remainder of the frequency domain coefficients.

5. The method of claim 1, wherein (d) further comprises:
    (i) causing the downhole processor to calculate an inaccuracy measure of using the higher priority coefficients to approximate the sequence of data items, wherein the higher priority coefficients are scaled, quantized, and adaptively selected based on the priorities assigned in (c) and a predetermined bit count;
    (ii) evaluating the inaccuracy measure;
    (iii) encoding the higher priority coefficients when the inaccuracy measure is minimized using a predetermined encoding algorithm for a borehole telemetry transmission; and
    (iv) changing a scaling factor and repeating (i) and (ii) when the inaccuracy measure is not minimized.

6. The method of claim 5, wherein the inaccuracy measure calculated in (i) is a mean squared error.

7. The method of claim 5, wherein the encoding in (iii) comprises Huffman encoding.

8. The method of claim 1, wherein the transmitting in (e) further comprises:
    (i) encoding the higher priority coefficients into a stream of bits; and
    (ii) transmitting the stream of bits to the surface processor.

9. The method of claim 1, wherein (e) is initiated in real-time prior to compressing the another scan in (b), (c), and (d).

10. The method of claim 1, wherein the frequency domain coefficients having larger amplitudes are assigned the higher priorities in (c).

11. The method of claim 10, wherein (c) further comprises analyzing a power spectrum to assign the priorities to the frequency domain coefficients.

12. A downhole tool configured for deployment in a bottom hole assembly, the downhole tool comprising a controller configured to:
    obtain a scan among a plurality of scans forming a downhole data log of a borehole within a subterranean formation, wherein the scan comprises a sequence of data items from a sensor in the bottom hole assembly located in a borehole, wherein each data item corresponds to an azimuth angle of the sensor;
    convert the sequence of data items in the scan into a plurality of frequency domain coefficients using a transform algorithm;
    assign priorities to the frequency domain coefficients by evaluating a statistical significance of each of the frequency domain coefficients using historical field data;
    iteratively discard lower priority coefficients and retaining higher priority coefficients; and
    transmitting the higher priority coefficients to a surface processor,
    wherein the controller is further configured to initiate in real-time said converting, said assigning priorities, and said iteratively discarding prior to obtaining another scan of the plurality of scans that is subsequent and adjacent to the scan.

* * * * *